(12) United States Patent
Fisher et al.

(10) Patent No.: US 12,359,303 B2
(45) Date of Patent: Jul. 15, 2025

(54) MODULAR SPUTTERING TARGET WITH PRECIOUS METAL INSERT AND SKIRT

(71) Applicant: Materion Corporation, Mayfield Heights, OH (US)

(72) Inventors: Matthew Fisher, Mayfield Heights, OH (US); James Guerrero, Mayfield Heights, OH (US); Chen Wang, Mayfield Heights, OH (US)

(73) Assignee: Materion Corporation

( * ) Notice: Subject to any disclaimer, the term of this patent is extended or adjusted under 35 U.S.C. 154(b) by 92 days.

(21) Appl. No.: 17/848,745

(22) Filed: Jun. 24, 2022

(65) Prior Publication Data
US 2022/0415631 A1 Dec. 29, 2022

Related U.S. Application Data

(60) Provisional application No. 63/214,411, filed on Jun. 24, 2021.

(51) Int. Cl.
*H01J 37/34* (2006.01)
*C23C 14/34* (2006.01)

(52) U.S. Cl.
CPC ...... *C23C 14/3407* (2013.01); *C23C 14/3414* (2013.01); *H01J 37/3417* (2013.01); *H01J 37/3423* (2013.01); *H01J 37/3426* (2013.01); *H01J 37/3429* (2013.01); *H01J 37/3435* (2013.01)

(58) Field of Classification Search
CPC ............... H01J 37/3426; H01J 37/3429; H01J 37/3435; C23C 14/3414; C23C 14/3407
See application file for complete search history.

(56) References Cited

U.S. PATENT DOCUMENTS

| | | | | |
|---|---|---|---|---|
| 5,334,302 A | * | 8/1994 | Kubo | H01J 37/3414 204/298.18 |
| 8,020,748 B2 | * | 9/2011 | Ivanov | B23K 20/122 228/2.1 |
| 8,821,701 B2 | * | 9/2014 | Higdon | C23C 14/3407 204/298.12 |
| 9,972,479 B2 | * | 5/2018 | Nakamura | H01J 37/3435 |
| 2002/0053512 A1 | | 5/2002 | Grohman et al. | |
| 2005/0263570 A1 | | 12/2005 | Koenigsmann et al. | |

(Continued)

FOREIGN PATENT DOCUMENTS

| | | |
|---|---|---|
| JP | H04103763 A | 4/1992 |
| JP | H07278806 A | 10/1995 |

(Continued)

OTHER PUBLICATIONS

Machine Translation WO 2015022166 (Year: 2015).*

(Continued)

*Primary Examiner* — Michael A Band
(74) *Attorney, Agent, or Firm* — COZEN O'CONNOR

(57) ABSTRACT

A sputtering target comprising a target insert comprising a target metal compound and a skirt structure including a primary skirt and a secondary skirt. The primary skirt is disposed adjacent least a portion of a secondary skirt and comprises a first metal compound. The secondary skirt comprises a second metal compound that is different from the first metal compound.

17 Claims, 1 Drawing Sheet

(56) References Cited

U.S. PATENT DOCUMENTS

| | | | | |
|---|---|---|---|---|
| 2006/0065517 | A1* | 3/2006 | Ivanov | C23C 14/3414 |
| | | | | 204/192.12 |
| 2006/0249372 | A1* | 11/2006 | Xiang | C23C 14/46 |
| | | | | 204/298.04 |
| 2015/0170887 | A1 | 6/2015 | Yuan et al. | |

FOREIGN PATENT DOCUMENTS

| | | | | | |
|---|---|---|---|---|---|
| JP | | 07292465 A | * | 11/1995 | |
| JP | | 2004143548 A | * | 5/2004 | |
| WO | WO-2015022166 A1 | * | 2/2015 | ......... | H01J 37/3435 |

OTHER PUBLICATIONS

"Beginner's Look at High-Temperature Sintered Parts". Horizon Technology. [https://www.horizontechnology.biz/blog/high-temperature-sintered-parts#:~:text=Sintering%20is%20a%20process%20of,them%20into%20a%20rigid%20structure.] (Year: 2018).*

Full passage of "What is High-Temperature Sintering Vs. Conventional Sintering?" from "Beginner's Look at High-Temperature Sintered Parts" by Horizon Technology cited as reference U above (computer issue with converting website to Adobe pdf showing the full passage). (Year: 2018).*

"International Search Report and Written Opinion" issued in PCT/US2022/034877, dated Oct. 14, 2022, 18 pages.

\* cited by examiner

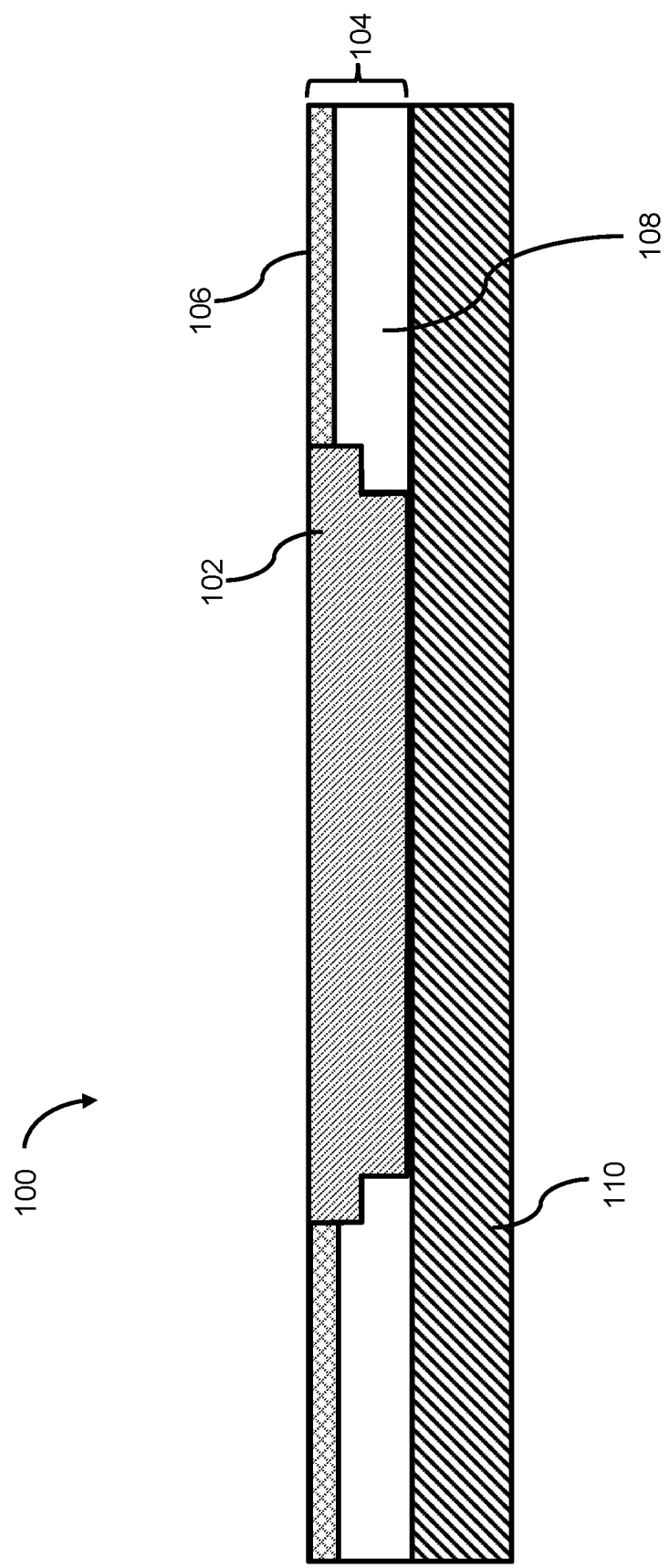

MODULAR SPUTTERING TARGET WITH PRECIOUS METAL INSERT AND SKIRT

CROSS REFERENCE TO RELATED APPLICATIONS

This application claims priority to U.S. Provisional Application No. 63/214,411, filed on Jun. 24, 2021, which is incorporated herein by reference.

FIELD

This disclosure relates to sputtering targets for deposition of precious metals, in particular to sputtering targets comprising a target insert and a skirt structure.

BACKGROUND

Sputtering deposition is a physical vapor deposition (PVD) method of thin film deposition. The sputtering process, very broadly, involves ejecting material from a sputtering target (the source of the material) onto a substrate. The availability of many process and material parameters make it a complex process. Beneficially, it also provides for a large degree of control over the growth and microstructure of the film thus created.

One type of sputtering is ion beam bombardment sputtering, in which a high energy source of ions is directed toward a target source (target insert). The force of the bombardment of ions imparts sufficient energy to the atoms of the target source to cause the energized atoms to leave the target source (sputter), form a particle flux, and deposit a thin film on a substrate. The advantages of using ion beam sputter deposition include isolation of the substrate from energetic electron bombardment and independent control over the ion energy and current density striking the target. The basic techniques of ion beam sputter deposition are well known.

Generally, any target source material that can be physically placed in a vacuum chamber can be sputtered by ion beam deposition. This includes materials comprised of a single chemical element, alloys, composites, and compounds. In depositing a thin film of a given chemical composition, where the target source is relied on as a primary source of deposition material, the target source can be prepared by vacuum, inert, or open atmosphere melting. The material is melted by induction, resistive, electric arc, or similar melting methods. The material is subsequently formed into an appropriate shape through known material processing methods. Alternatively, the material may be formed by a number of powder consolidation methods such as press and sinter, hot isostatic pressing, uniaxial hot pressing or similar well-known techniques. These methods can be designed to produce material of a high purity and structural integrity. Deposition targets are typically attached to a backing holder or plate by a bonding layer for accurate placement in the vacuum chamber. The bonding layer usually comprises solder.

As the ion beam crosses over the target insert to initiate the sputtering, the beam, due in some cases to process inconsistencies, may contact areas other than the target itself. Often times, an outer skirt is utilized to hold the target insert in place. As one example, U.S. Pat. No. 6,755,944 discloses an ion beam deposition target source consisting of a removable, centrally located inner insert surrounded by an outer region. The insert can be removed and replaced when eroded, while the outer region of the target source not eroded by the ion beam remains in place attached to a backing plate. The inner insert and the outer region are joined to each other by an interface comprising an interlocking lip or grove structure located on opposing mating surfaces on the inner insert and outer region, thereby forming the deposition target source when these components are united. The deposition target source can be attached by a bonding layer to a backing plate which is installed into an ion beam deposition machine.

The outer skirt may, detrimentally, be contacted by the ion beam. As a result, the skirt itself becomes a target material that disadvantageously emits contaminating particles therefrom. This contamination has a deleterious effect on the desired film composition and characteristics.

To ameliorate this problem, the skirt material may be constructed by the same high purity (and high cost) precious metal/alloy as the target insert. Unfortunately, the utilization of significantly greater amounts precious metal in the sputtering target adds cost, especially in current times, where precious metal prices are historically high.

Thus, even in view of the known technology, the need exists for a sputtering target having an outer skirt that effectively secures the target insert while minimizing or eliminating film contamination and reducing precious metal content and overall cost.

SUMMARY

In one embodiment, the disclosure relates to a sputtering target comprising a target insert and a skirt structure. The target insert comprises a target metal compound, and preferably the target metal compound comprises rhodium, ruthenium, platinum, gold, iridium, cobalt, tantalum, tungsten, or silver, or combinations or alloys thereof. The skirt structure includes a primary skirt and a secondary skirt, and the primary skirt is disposed adjacent least a portion of a secondary skirt. The primary skirt comprises a first metal compound, e.g., rhodium, ruthenium, platinum, gold, iridium, cobalt, tantalum, or silver, or combinations thereof. The secondary skirt comprises a second metal compound, e.g., copper, nickel, aluminum, or combinations or alloys thereof. In one embodiment, the second metal compound is different than the first metal compound. The first metal compound optionally comprises the same metal as the target insert. The primary skirt may have a thickness ranging from 10 microns to 6350 microns, the secondary skirt may have a thickness ranging from 100 microns to 25000 microns, preferably from 100 microns to 6350 microns, and/or the ratio of primary skirt thickness to secondary skirt thickness may be less than 5:1. The CTE of the first metal compound may range from 5.5 to 11.5, the CTE of the second metal compound may range from 11.5 to 21.5, and/or the variance between the CTE of the first metal compound and the CTE of the second metal compound may be less than 200%. The conductivity of the first metal compound may range from 100 to 200, the conductivity of the second metal compound may range from 315 to 515, and/or the variance between the conductivity of the first metal compound and the conductivity of the second metal compound may be less than 200%. The primary skirt may be bonded, e.g., via soldering or diffusion bonding, to the secondary skirt. In some cases, the bonding is not achieved via coating or plating. The target may further comprise a backing plate disposed beneath the target insert and beneath the skirt and/or a bonding layer disposed between the primary skirt and the secondary skirt. In use with a substrate, the target may demonstrate a deposition rate that varies by less than 25% across the substrate and/or a film uniformity that varies by less than 25% across the substrate.

In one embodiment, the disclosure relates to a sputtering target comprising a target insert comprising a target metal compound and a skirt structure including a primary skirt and a secondary skirt, wherein the primary skirt is bonded to the secondary skirt; the primary skirt comprising a first metal compound and the secondary skirt comprising a second metal compound that is different from the first metal. The primary skirt may be bonded, e.g., via soldering or diffusion bonding, to the secondary skirt. In some cases, the bonding is not achieved via coating or plating. The target insert comprises a target metal compound, and preferably the target metal compound comprises rhodium, ruthenium, platinum, gold, iridium, cobalt, tantalum, tungsten, or silver, or combinations or alloys thereof. The skirt structure includes a primary skirt and a secondary skirt, and the primary skirt is disposed adjacent least a portion of a secondary skirt. The primary skirt comprises a first metal compound, e.g., rhodium, ruthenium, platinum, gold, iridium, cobalt, tantalum, or silver, or combinations thereof. The secondary skirt comprises a second metal compound, e.g., copper, nickel, aluminum, or combinations or alloys thereof. In one embodiment, the second metal compound is different than the first metal compound. The first metal compound optionally comprises the same metal as the target insert. The primary skirt may have a thickness ranging from 10 microns to 6350 microns, the secondary skirt may have a thickness ranging from 100 microns to 25000 microns, preferably from 100 microns to 6350 microns, and/or the ratio of primary skirt thickness to secondary skirt thickness may be less than 5:1. The CTE of the first metal compound may range from 5.5 to 11.5, the CTE of the second metal compound may range from 11.5 to 21.5, and/or the variance between the CTE of the first metal compound and the CTE of the second metal compound may be less than 200%. The conductivity of the first metal compound may range from 100 to 200, the conductivity of the second metal compound may range from 315 to 515, and/or the variance between the conductivity of the first metal compound and the conductivity of the second metal compound may be less than 200%. The target may further comprise a backing plate disposed beneath the target insert and beneath the skirt and/or a bonding layer disposed between the primary skirt and the secondary skirt. In use with a substrate, the target may demonstrate a deposition rate that varies by less than 25% across the substrate and/or a film uniformity that varies by less than 25% across the substrate.

In one embodiment, the disclosure relates to a sputtering target comprising a target insert comprising a target metal compound and a skirt structure including a primary skirt and a secondary skirt, wherein the ratio of primary skirt thickness to secondary skirt thickness is less than 5:1; the primary skirt comprising a first metal compound and the secondary skirt comprising a second metal compound that is different from the first metal. The target insert comprises a target metal compound, and preferably the target metal compound comprises rhodium, ruthenium, platinum, gold, iridium, cobalt, tantalum, tungsten, or silver, or combinations or alloys thereof. The skirt structure includes a primary skirt and a secondary skirt, and the primary skirt is disposed adjacent least a portion of a secondary skirt. The primary skirt comprises a first metal compound, e.g., rhodium, ruthenium, platinum, gold, iridium, cobalt, tantalum, or silver, or combinations thereof. The secondary skirt comprises a second metal compound, e.g., copper, nickel, aluminum, or combinations or alloys thereof. In one embodiment, the second metal compound is different than the first metal compound. The first metal compound optionally comprises the same metal as the target insert. The primary skirt may have a thickness ranging from 10 microns to 6350 microns, the secondary skirt may have a thickness ranging from 100 microns to 25000 microns, preferably from 100 microns to 6350 microns. The CTE of the first metal compound may range from 5.5 to 11.5, the CTE of the second metal compound may range from 11.5 to 21.5, and/or the variance between the CTE of the first metal compound and the CTE of the second metal compound may be less than 200%. The conductivity of the first metal compound may range from 100 to 200, the conductivity of the second metal compound may range from 315 to 515, and/or the variance between the conductivity of the first metal compound and the conductivity of the second metal compound may be less than 200%. The primary skirt may be bonded, e.g., via soldering or diffusion bonding, to the secondary skirt. In some cases, the bonding is not achieved via coating or plating. The target may further comprise a backing plate disposed beneath the target insert and beneath the skirt and/or a bonding layer disposed between the primary skirt and the secondary skirt. In use with a substrate, the target may demonstrate a deposition rate that varies by less than 25% across the substrate and/or a film uniformity that varies by less than 25% across the substrate.

BRIEF DESCRIPTION OF THE DRAWINGS

The FIGURE is a cross sectional view of a sputtering target of one embodiment of this disclosure.

DETAILED DESCRIPTION

Introduction

As noted above, conventional sputtering targets may comprise a target insert and a skirt for holding the insert in place. Typically the skirt material is constructed of the same high purity (and high cost) precious metal/alloy as the target insert, which results in a sputtering target that is not cost-effective due at least in part to the high cost of typical target precious metals, e.g., rhodium, gold, or platinum. In the past, when the cost of precious metals was not nearly as high, there was no appreciation in the art for addressing the composition of the skirt material, especially in view of the complexity and process steps that such a two-part or two-layer construction would entail. Stated another way, two layer skirt configurations are not discussed or addressed in the prior literature.

The inventors have now found that the utilization of a skirt that comprises two components—a primary skirt comprising a first precious target metal compound and a secondary skirt comprising a second (less costly) metal compound—effectively reduces or eliminates film contamination, while contemporaneously and advantageously reducing the overall precious metal content of the sputtering target. It has been discovered that, when configured as described herein, the primary skirt, when contacted by the ion beam, sputters high purity deposition particles with minimal impurities. In some cases, the ion beam does not reach the secondary skirt (or only contacts it in a nominal manner). When the primary and secondary skirts are configured in this fashion (and in particular at the thicknesses and thickness ratios described herein), little, if any, undesirable deposition particles are released therefrom the skirt structure as a whole. Thus, the synergistic combination of the primary skirt and the secondary skirt achieve the beneficial goals of effectively securing the target insert while minimizing or eliminating film contamination and reducing precious metal content and overall cost.

In contrast, conventional skirt configurations have either been constructed either entirely of expensive precious metal, or entirely of less costly metals, which create film contamination when contacted by an ion beam. These conventional skirt configurations have the demonstrated the process/cost problems discussed herein.

Sputtering Target

In one embodiment, the disclosure relates to a sputtering target comprising a target insert comprising a target metal and a skirt structure for holding the target insert in place.

The skirt structure advantageously includes both a primary skirt and a secondary skirt (in contrast to conventional skirt configurations). The primary skirt is disposed adjacent least a portion of a secondary skirt, e.g., the primary skirt may be layered atop the secondary skirt. The primary skirt comprises a first metal compound, and the secondary skirt comprises a second metal compound. Importantly, the first metal compound may be different from the second metal compound, e.g., the first metal compound comprises a precious metal target metal while the second metal compound comprises a less expensive "filler" metal. The use of the first and second metal compounds in this manner provides for the aforementioned benefits.

In some cases, the primary skirt and the secondary skirt (and optional other skirt components in the skirt structure) are configured as layers. For example, the primary may be a layer that is positioned on top of at least a portion of the secondary skirt, which may also be a layer, e.g., sitting atop a backing plate. In some cases, the primary skirt is disposed such that it is substantially coplanar with the target insert, e.g., coplanar with the target insert.

As noted above, the insert can beneficially be removed and replaced when eroded. The skirt structure that is not eroded by the ion beam can either remain in place (attached to a backing plate) or be reused with a new central insert if the target source is to be removed for more efficient recycling. The advantages of the aforementioned skirt configuration are applicable to the use of a replacement target insert. For example, when a target insert is replaced, the same skirt structure may be employed, thus allowing replacement target insert to be secured while also minimizing or eliminating film contamination and reducing precious metal content and overall cost.

The sputtering target source may be made in a variety of shapes and sizes, and may comprise of a variety of materials including, but not limited to, metal and metal alloys, composites, ceramic compounds, and other chemical compositions (see discussion below). In some cases, the sputtering target is in a round shape having a diameter from about 25 cm to about 40 cm, an oval shape having a dimension of about 22 cm×30 cm, and a rectangular shape having the dimensions of about 25 cm×36 cm. These dimensions are merely exemplary and are not intended to limit the scope of the disclosure.

Target Insert and Skirt Structure

Target inserts, generally, are fairly well known. And the configuration of the target insert may vary widely. In some cases, the insert is centrally located. The skirt structure may be disposed adjacent the target insert (at least in part) and may hold the insert in place. In some cases, the skirt (completely) surrounds the insert and holds the insert in place. For example, the insert and the skirt may be closely configured or joined to one another. In some embodiments, an interlocking interface may be employed to establish a connection between the insert and the skirt structure so as to prevent contaminants, e.g., non-precious metal atoms, from being formed in the particle flux.

The target insert comprises (is made of) a target metal compound. The target metal provides the material that is sputtered to create the film on the substrate. Target metal compounds are well known, may vary widely, and generally are high-cost metals or alloys. The target metal compound may be one or more precious metals. Exemplary target metals/alloys include, but are not limited to rhodium, ruthenium, platinum, gold, iridium, cobalt, tantalum, tungsten, or silver, or combinations or alloys thereof. The target metal may also include combinations and alloys of the aforementioned metals. In some cases, the target metal is rhodium. Broadly speaking, the target metal compound may be any material or compound that may be effectively sputtered onto a substrate.

As noted above the skirt structure comprises the primary skirt and the secondary skirt. In some cases, the primary skirt and the secondary skirt are bonded to one another. As an example, the bonding may be achieved via soldering or diffusion bonding. In some embodiments, the bonding is not achieved via a coating process or via plating. The inventors have found that, in some cases, coating and plating are to be avoided due to problems arising from extra, unnecessary processing steps that are required. Also, supply chain issues have been found to be notable with coating and plating. In contrast, the use of other methods, such as those mentioned above, provides for efficiencies in bonding, e.g., consistency of coefficient of thermal expansion (CTE) across the skirt structure, as well as processing efficiencies, along with improved interlayer adhesion, which is particularly important under sputtering operation conditions, e.g., higher temperatures. Processing efficiencies include, for example elimination of process steps, process conditions, and logistic issues. By employing methods such as soldering or diffusion bonding, fewer processing steps and/or logistics are required.

The primary skirt is the portion that may be (inadvertently) contacted by the ion beam. For at least this reason, the primary skirt may be constructed of high purity metal/alloy, similar to, if not the same as, the target metal/alloy. The primary skirt comprises a first metal compound, which may include the metals mentioned above with respect to the target metal. In some cases, the first metal compound comprises the same metal as the target metal compound. In some embodiments, the first metal compound and/or the target metal compound are high purity metals, e.g., pure metals with little or no contamination, for example, less than 10 wt % other metals, e.g., less than 5 wt %, less than 3 wt %, less than 1 wt %, less than 0.5 wt %, or less than 0.1 wt %.

In some embodiments, the first metal compound and the target metal compound are both alloys and some of the alloy metals are present both in the first metal compound and the target metal compound, e.g., there may be some overlap of metals in the first metal compound and the target metal compound.

The secondary skirt serves the purpose of working in conjunction with the primary skirt to secure target insert in the sputtering target. It has been discovered that when the primary skirt is employed, the metallurgy of the secondary skirt (the composition of the second metal compound), advantageously, may be of lower cost metal(s). One tenet of the invention is the ability to effectively replace some of the skirt that is generally made of more expensive material with at least some portion of less expensive material (the secondary skirt).

Second metal compounds are generally known and are lower-cost metals or alloys. Exemplary second metals/alloys include, but are not limited to copper, nickel, aluminum, or (optionally) cobalt, or combinations or alloys thereof. In some cases, cobalt may be included in the second metal compound and in the first metal compound, but in significantly different, e.g., higher, amounts. The second metal compound may also include combinations and alloys of the aforementioned metals. In some cases, the second metal is copper. In some cases, the second metal compound (or in some instances the first metal compound) may not be a metal, per se. The second metal (or in some instances the first metal compound) may include materials comprised of a single chemical element, alloys, composites, polymers, oxides, ceramics, fillers, and other compounds. Generally, these materials or compounds are high cost. Other known filler materials are contemplated.

In some cases, one or more of these components in the listings this section may be expressly excluded, e.g., via claim language. This is contemplated herein. For example, the disclosed composition may exclude cobalt as a first metal compound or aluminum may be excluded as a second metal compound. This exclusion option is not limited to these particular examples, but rather is applicable to all other components or steps in listings herein. This provides support for express exclusion of one or more of these components in claim language.

The inventors have further found that the thicknesses of the skirt structure components are important. In particular, the thickness of the primary skirt must be sufficient to be contacted by the ion beam without allowing the ion beam to reach the second skirt, thus sputtering undesirable contaminant particles. In some embodiments, the primary skirt has a thickness of greater than 10 microns, e.g., greater than 20 microns, greater than 50 microns, greater than 100 microns, greater than 300 microns, greater than 500 microns, greater than 800 microns, greater than 1000 microns, greater than 2000 microns, greater than 3000 microns, greater than 4000 microns, greater than 5000 microns, or greater than 6000 microns. In terms of ranges, the primary skirt may have a thickness ranging from 10 microns to 15000 microns, e.g., from 100 microns to 10000 microns, from 10 microns to 7000 microns, from 10 microns to 6350 microns, from 50 microns to 5000 microns, from 100 microns to 4000 microns, from 500 microns to 3500 microns, from 500 microns to 3000 microns, or from 1000 microns to 2500 microns. In terms of upper limits, the primary skirt may have a thickness less than 15000 microns, e.g., less than 12000 microns, less than 10000 microns, less than 7000 microns, less than 6000 microns, less than 5000 microns, less than 4000 microns, less than 3500 microns, less than 3000 microns, less than 2500 microns, less than 2000 microns, or less than 1500 microns.

In some cases, the secondary skirt has a thickness of greater than 100 microns, e.g., greater than 500 microns, greater than 800 microns, greater than 1000 microns, greater than 2000 microns, greater than 3000 microns, greater than 4000 microns, greater than 5000 microns, or greater than 6000 microns. In terms of ranges, the secondary skirt may have a thickness ranging from 100 microns to 25000 microns, e.g., from 100 microns to 6350 microns, from 500 microns to 20000 microns, from 500 microns to 15000 microns, from 500 microns to 10000 microns, from 500 microns to 7000 microns, from 1000 microns to 6000 microns, from 2000 microns to 6000 microns, or from 3000 microns to 5000 microns. In terms of upper limits, the secondary skirt may have a thickness of less than 25000 microns, e.g., less than 20000 microns, less than 15000 microns, less than 10000 microns, less than 7000 microns, e.g., less than 6000 microns, less than 5000 microns, less than 4000 microns, less than 3500 microns, less than 3000 microns, less than 2500 microns, less than 2000 microns, or less than 1500 microns.

As used herein, "greater than" and "less than" limits may also include the number associated therewith. Stated another way, "greater than" and "less than" may be interpreted as "greater than or equal to" and "less than or equal to." It is contemplated that this language may be subsequently modified in the claims to include "or equal to." For example, "greater than 4.0" may be interpreted as, and subsequently modified in the claims as "greater than or equal to 4.0."

Importantly, in some cases, the ratio of primary skirt thickness to secondary skirt thickness less than 5:1, e.g., less than 2:1, less than 1:1, less than 0.7:1, less than 0.5:1, less than 0.3:1, less than 0.2:1, or less than 0.1:1. In some cases, the primary skirt is thinner than the secondary skirt. In some embodiments, the primary skirt must still be robust enough to prevent the ion beam from reaching the second skirt. For example, the ratio of primary skirt thickness to secondary skirt thickness may be greater than 0.1:1, e.g., greater than 0.2:1, greater than 0.3:1, greater than 0.4:1, greater than 0.5:1, greater than 0.6:1, greater than 0.7:1, greater than 0.8:1, greater than 0.9:1, or greater than 1:1.

The first metal compound and the second metal compounds must also interact sufficiently well with one another. The properties of the metal compound, in some cases, should not be too disparate.

The CTE (@0-100 C ($\times 10^{-6}$ C$^{-1}$)) of the first metal compound may range from 4 to 20, e.g., from 5 to 19, from 7 to 15, from 5 to 11, from 5.5 to 10.5, from 6 to 10, from 6.5 to 9.5, from 7 to 9, or from 7.5 to 8.5. In terms of upper limits, the CTE of the first metal may be less than 20, e.g., less than 19, less than 15, less than 12, less than 10.5, less than 10, less than 9.5, less than 9, or less than 8.5. In terms of lower limits, the CTE of the first metal may be greater than 4, e.g., greater than 5, greater than 5.5, greater than 6, greater than 6.5, greater than 7, greater than 7.5, greater than 8, or greater than 8.5.

The CTE (@0-100 C ($\times 10^{-6}$ C$^{-1}$)) of the second metal compound may range from 4 to 20, e.g., from 4 to 18, from 5 to 15, from 11.5 to 21.5, e.g., from 13.5 to 19.5, from 14.5 to 18.5, from 15.5 to 17.5, or from 16 to 17. In terms of upper limits, the CTE of the second metal may be less than 21.5, e.g., less than 20, less than 19.5, less than 18.5, less than 17.5, or less than 17. In terms of lower limits, the CTE of the second metal may be greater than 4, e.g., greater than 6, greater than 8, greater than 10, 11.5, e.g., greater than 13.5, greater than 14.5, greater than 15.5, or greater than 16.

The conductivity (@0-100 C (W m$^{-1}$ K$^{-1}$)) of the first metal compound may range from 50 to 350, e.g., from 50 to 300, from 100 to 300, from 100 to 250, from 120 to 180, from 130 to 170, from 140 to 160, or from 145 to 155. In terms of upper limits, the conductivity of the first metal compound may be less than 350, e.g., less than 300, less than 250, less than 200, less than 180, less than 170, less than 160, or less than 155. In terms of lower limits, the conductivity of the first metal compound may be greater than 50, e.g., greater than 100, greater than 120, greater than 130, greater than 140, or greater than 145.

The conductivity (@0-100 C (W m$^{-1}$ K$^{-1}$)) of the second metal compound may range from 200 to 515, e.g., from 200 to 450, from 250 to 400, from 315 to 515, from 365 to 465, from 390 to 440, from 400 to 430, or from 410 to 420. In terms of upper limits, the conductivity of the second metal compound may be less than 515, e.g., less than 465, less than 440, less than 430, or less than 420. In terms of lower limits, the conductivity of the second metal compound may be greater than 200, e.g., greater than 250, greater than 300, greater than 315. greater than 365, greater than 390, greater than 400, or greater than 410.

In some embodiments variance between the CTE of the first metal compound and the CTE of the second metal compound is less than 200%, e.g., less than 150%, less than 100%, less than 75%, less than 50%, less than 25%, or less than 10%.

In some embodiments variance between the conductivity of the first metal compound and the conductivity of the second metal compound is less than 200%, e.g., less than 150%, less than 100%, less than 75%, less than 50%, less than 25%, or less than 10%.

By managing these characteristics, improved bonding between the primary and secondary skirts are surprisingly improved. For example, a uniform bond and a uniform target are achieved, e.g., adhesion is high and hot spots are minimized or eliminated. As a result, when employed with a substrate in a sputtering operation, the sputtering target demonstrates a deposition rate (angstroms/sec) that varies by less than 25% across the substrate, e.g., less than 20%, less than 15%, less than 10%, less than 5%, or less than 1%. As another benefit, when employed with a substrate in a sputtering operation, the sputtering target demonstrates a film uniformity that varies by less than 25% across the substrate, e.g., less than 20%, less than 15%, less than 10%, less than 5%, or less than 1%.

Bonding Layer and Other Layers

In addition to the aforementioned components, the sputtering target may further comprise other layers. For example, the sputtering target may further comprise a bonding layer disposed between the primary skirt and the secondary skirt. The bonding layer may be a result of the bonding operation, e.g., the soldering, diffusion bonding, or plating operations. Multiple bonding layers are contemplated. The composition and processing of bonding layers may vary widely. Some bonding layer formation techniques are known. The bonding layer, in some cases, comprises solder.

In some cases, comprising a backing plate disposed beneath the target insert and beneath the skirt. Backing plate may vary widely, and may conventional backing plates are known in the art. In some cases, the target and/or the skirt structure may be attached by a bonding layer to the backing plate located on an Ion Beam Deposition (IBD) machine.

The FIGURE shows exemplary sputtering target 100, which comprises target insert 102 and skirt structure 104. In this particular case, skirt structure 104 surrounds and receives the target insert 102. As indicated in FIGURE, skirt structure comprise primary skirt 106 and secondary skirt 108, which are constructed and configured as described herein. Target insert 102 and skirt structure 104 are disposed atop backing plate 110.

In some cases, once the target becomes sufficiently eroded such that replacement is required, the backing plate may be heated to a temperature sufficient to melt the solder, thereby permitting the removal of the eroded insert, which demonstrates the modular nature of the disclosed sputtering target.

EMBODIMENTS

The following embodiments are contemplated. All combinations of features and embodiments are contemplated.

Embodiment 1: a sputtering target comprising a target insert comprising a target metal compound; a skirt structure including a primary skirt and a secondary skirt, the primary skirt disposed adjacent least a portion of a secondary skirt; the primary skirt comprising a first metal compound and the secondary skirt comprising a second metal compound that is different from the first metal compound.

Embodiment 2: an embodiment of embodiment 1 wherein the first metal compound comprises the same metal as the target insert.

Embodiment 3: an embodiment of embodiment 1 or 2 wherein the first metal compound comprises rhodium, ruthenium, platinum, gold, iridium, cobalt, tantalum, or silver, or combinations thereof.

Embodiment 4: an embodiment of embodiments 1-3 wherein the second metal compound comprises copper, nickel, aluminum, or combinations or alloys thereof.

Embodiment 5: an embodiment of embodiments 1-4 wherein the target metal comprises rhodium, ruthenium, platinum, gold, iridium, cobalt, tantalum, tungsten, or silver, or combinations or alloys thereof.

Embodiment 6: an embodiment of embodiments 1-5 wherein the primary skirt has a thickness ranging from 10 microns to 6350 microns.

Embodiment 7: an embodiment of embodiments 1-6 wherein the secondary skirt has a thickness ranging from 100 microns to 25000 microns, preferably from 100 microns to 6350 microns.

Embodiment 8: an embodiment of embodiments 1-7 wherein the ratio of primary skirt thickness to secondary skirt thickness is less than 5:1.

Embodiment 9: an embodiment of embodiments 1-8 wherein the CTE of the first metal compound ranges from 5.5 to 11.5, and the CTE of the second metal compound ranges from 11.5 to 21.5, and the variance between the CTE of the first metal compound and the CTE of the second metal compound is less than 200%.

Embodiment 10: an embodiment of embodiments 1-9 wherein conductivity of the first metal compound ranges from 100 to 200, and the conductivity of the second metal compound ranges from 315 to 515, and the variance between the conductivity of the first metal compound and the conductivity of the second metal compound is less than 200%.

Embodiment 11: an embodiment of embodiments 1-10 wherein the primary skirt is bonded to the secondary skirt.

Embodiment 12: an embodiment of embodiments 1-11 wherein the bonding is achieved via soldering or diffusion bonding.

Embodiment 13: an embodiment of embodiments 1-12 wherein the bonding is not achieved via coating or plating.

Embodiment 14: an embodiment of embodiments 1-13 further comprising a backing plate disposed beneath the target insert and beneath the skirt.

Embodiment 15: an embodiment of embodiments 1-14 further comprising a bonding layer disposed between the primary skirt and the secondary skirt.

Embodiment 16: an embodiment of embodiments 1-15 wherein in use with a substrate, the target demonstrates a deposition rate that varies by less than 25% across the substrate.

Embodiment 17: an embodiment of embodiments 1-16 wherein in use with a substrate, the target demonstrates a film uniformity that varies by less than 25% across the substrate.

Embodiment 18: a sputtering target comprising a target insert comprising a target metal compound; a skirt structure including a primary skirt and a secondary skirt, wherein the primary skirt is bonded to the secondary skirt; the primary skirt comprising a first metal compound and the secondary skirt comprising a second metal compound that is different from the first metal.

Embodiment 19: an embodiment of 18 wherein the bonding is achieved via soldering or diffusion bonding, and is preferably not achieved via coating or plating.

Embodiment 20: a sputtering target comprising a target insert comprising a target metal compound; a skirt structure including a primary skirt and a secondary skirt, wherein the ratio of primary skirt thickness to secondary skirt thickness is less than 5:1; the primary skirt comprising a first metal compound and the secondary skirt comprising a second metal compound that is different from the first metal.

Embodiment 21: an embodiment of embodiment 20 wherein the first metal compound comprises the same metal as the target insert.

Embodiment 22: an embodiment of embodiment 20 or 21 wherein the first metal compound comprises rhodium, ruthenium, platinum, gold, iridium, cobalt, tantalum, or silver, or combinations thereof.

Embodiment 23: an embodiment of embodiments 20-22 wherein the second metal compound comprises copper, nickel, aluminum, or combinations or alloys thereof.

Embodiment 24: an embodiment of embodiments 20-23 wherein the target metal comprises rhodium, ruthenium, platinum, gold, iridium, cobalt, tantalum, tungsten, or silver, or combinations or alloys thereof.

Embodiment 25: an embodiment of embodiments 20-24 wherein the primary skirt has a thickness ranging from 10 microns to 6350 microns.

Embodiment 26: an embodiment of embodiments 20-25 wherein the secondary skirt has a thickness ranging from 100 microns to 25000 microns, from 100 microns to 6350 microns.

While the invention has been described in detail, modifications within the spirit and scope of the invention will be readily apparent to those of skill in the art. In view of the foregoing discussion, relevant knowledge in the art and references discussed above in connection with the Background and Detailed Description, the disclosures of which are all incorporated herein by reference. In addition, it should be understood that aspects of the invention and portions of various embodiments and various features recited below and/or in the appended claims may be combined or interchanged either in whole or in part. In the foregoing descriptions of the various embodiments, those embodiments which refer to another embodiment may be appropriately combined with other embodiments as will be appreciated by one of skill in the art. Furthermore, those of ordinary skill in the art will appreciate that the foregoing description is by way of example only, and is not intended to limit.

The invention claimed is:

1. A sputtering target comprising:
a target insert having an uppermost surface with a first diameter and a bottom surface with a second diameter and comprising a target metal compound comprising a precious metal of at least one of rhodium, ruthenium, platinum, gold, iridium, cobalt, tantalum, tungsten, or silver; and
a skirt structure including a primary skirt having a first thickness, a first diameter, and a top surface, and a secondary skirt having a second thickness and a top portion with a second diameter and a bottom portion with a third diameter, the primary skirt disposed adjacent least a portion of a secondary skirt, and the first thickness less than the second thickness;
the primary skirt comprising a first metal compound and the secondary skirt comprising a second metal compound that is different from the first metal compound;
wherein the top surface of the primary skirt laterally surrounds the uppermost surface of the target insert;
wherein the primary skirt is positioned on top of at least a portion of the secondary skirt;
wherein the secondary skirt is positioned on top of a backing plate;
wherein the target insert is embedded in the primary skirt and the secondary skirt, such that the target insert contacts both the secondary skirt and the primary skirt; and
wherein the first diameter of the primary skirt is substantially the same as the second diameter of the secondary skirt, and the third diameter of the secondary skirt is smaller than the second diameter of the secondary skirt, and the first diameter of the target insert is greater than the second diameter of the target insert.

2. The sputtering target of claim 1, wherein the first metal compound comprises the same precious metal as the target insert.

3. The sputtering target of claim 1, wherein the second metal compound comprises copper, nickel, aluminum, or combinations or alloys thereof.

4. The sputtering target of claim 1, wherein the first thickness ranges from 10 microns to 6350 microns.

5. The sputtering target of claim 1, wherein the second thickness ranges from 100 microns to 6350 microns.

6. The sputtering target of claim 1, wherein a ratio of the first thickness to the second thickness is less than 5:1.

7. The sputtering target of claim 1, wherein a CTE of the first metal compound ranges—from 5.5 to 11.5, and a CTE of the second metal compound ranges from 11.5 to 21.5, and a variance between the CTE of the first metal compound and the CTE of the second metal compound is less than 200%.

8. The sputtering target of claim 1, wherein a conductivity of the first metal compound ranges from 100 to 200 @0-100° C. $(Wm^{-1}k^{-1})$, and a conductivity of the second metal compound ranges from 315 to 515 @0-100° C. $(Wm^{-1}k^{-1})$, and a variance between the conductivity of the first metal compound and the conductivity of the second metal compound is less than 200%.

9. The sputtering target of claim 1, wherein the primary skirt is bonded to the secondary skirt.

10. The sputtering target of claim 9, wherein the bonding is achieved via soldering or diffusion bonding.

11. The sputtering target of claim 9, wherein the bonding is not achieved via coating or plating.

12. The sputtering target of claim 1, further comprising a bonding layer disposed between the primary skirt and the secondary skirt.

13. The sputtering target of claim 1, wherein in use with a substrate, the sputtering target demonstrates a deposition rate that varies by less than 25% across the substrate.

14. The sputtering target of claim 1, wherein in use with a substrate, the sputtering target demonstrates a film uniformity that varies by less than 25% across the substrate.

15. A sputtering target comprising:
a target insert having an uppermost surface with a first diameter and a bottom surface with a second diameter and comprising a target metal compound comprising a precious metal of at least one of rhodium, ruthenium, platinum, gold, iridium, cobalt, tantalum, tungsten, or silver; and a skirt structure including a primary skirt having a first diameter and a first thickness and a secondary skirt having a second thickness and a top portion with a second diameter and a bottom portion with a third diameter, wherein the primary skirt is bonded to the secondary skirt;

the first thickness being less than the second thickness;

the primary skirt comprising a first metal compound and the secondary skirt comprising a second metal compound that is different from the first metal;

wherein a top surface of the primary skirt laterally surrounds the uppermost surface of the target insert; and wherein the primary skirt is positioned on top of at least a portion of the secondary skirt;

wherein the secondary skirt is positioned on top of a backing plate;

wherein the target insert is embedded in the primary skirt and the secondary skirt, such that the target insert contacts both the secondary skirt and the primary skirt; and wherein the first diameter of the primary skirt is substantially the same as the second diameter of the secondary skirt, and the third diameter of the secondary skirt is smaller than the second diameter of the secondary skirt, and the first diameter of the target insert is greater than the second diameter of the target insert.

16. The sputtering target of claim 15, wherein the bonding is achieved via soldering or diffusion bonding.

17. A sputtering target comprising:

a target insert having an uppermost surface with a first diameter and a bottom surface with a second diameter and comprising a target metal compound comprising a precious metal of at least one of rhodium, ruthenium, platinum, gold, iridium, cobalt, tantalum, tungsten, or silver; and a skirt structure including a primary skirt having a first diameter and a secondary skirt having a top portion with a second diameter and a bottom portion with a third diameter, wherein a ratio of primary skirt thickness to secondary skirt thickness is less than 5:1, and wherein the primary skirt thickness is less than the secondary skirt thickness;

the primary skirt comprising a first metal compound and the secondary skirt comprising a second metal compound that is different from the first metal compound;

wherein a top surface of the primary skirt laterally surrounds the uppermost surface of the target insert; and wherein the primary skirt is positioned on top of at least a portion of the secondary skirt;

wherein the secondary skirt is positioned on top of a backing plate;

wherein the target insert is embedded in the primary skirt and the secondary skirt, such that the target insert contacts both the secondary skirt and the primary skirt; and wherein the first diameter of the primary skirt is substantially the same as the second diameter of the secondary skirt, and the third diameter of the secondary skirt is smaller than the second diameter of the secondary skirt, and the first diameter of the target insert is greater than the second diameter of the target insert.

* * * * *